(12) United States Patent  
Harris

(10) Patent No.: US 8,766,510 B2  
(45) Date of Patent: Jul. 1, 2014

(54) ACTUATOR

(75) Inventor: Neil John Harris, Cambourne (GB)

(73) Assignee: NVF Tech Ltd., Cambridgeshire (GB)

( * ) Notice: Subject to any disclaimer, the term of this patent is extended or adjusted under 35 U.S.C. 154(b) by 130 days.

(21) Appl. No.: 13/379,376

(22) PCT Filed: Jun. 14, 2010

(86) PCT No.: PCT/GB2010/050987  
§ 371 (c)(1),  
(2), (4) Date: Mar. 7, 2012

(87) PCT Pub. No.: WO2011/001158  
PCT Pub. Date: Jan. 6, 2011

(65) Prior Publication Data  
US 2012/0169185 A1      Jul. 5, 2012

(30) Foreign Application Priority Data

Jun. 30, 2009  (GB) .................................. 0911295.4

(51) Int. Cl.
*H01L 41/09* (2006.01)
*H01L 41/22* (2013.01)
*H02K 41/03* (2006.01)

(52) U.S. Cl.
USPC ...... 310/316.01; 310/317; 310/324; 310/365; 29/25.35

(58) Field of Classification Search
USPC .............. 310/311, 314–319, 324, 328, 12.16; 29/25.35

See application file for complete search history.

(56) References Cited

U.S. PATENT DOCUMENTS 4,414,436 A * 11/1983 Sashida et al. ................ 381/152  
8,311,248 B2 * 11/2012 Bai et al. ........................ 381/190  
2010/0028134 A1 * 2/2010 Slapak et al. ................. 415/119

FOREIGN PATENT DOCUMENTS

WO           0154450           7/2001

* cited by examiner

*Primary Examiner* — Thomas Dougherty  
(74) *Attorney, Agent, or Firm* — Gable Gotwals

(57) ABSTRACT

The invention relates to a method of making an actuator comprising a plurality of force elements and an actuator made according to the method. The method comprises providing a coupler for coupling force from the force elements to a load; calculating a transfer function for each force element wherein the transfer functions allow the force provided to the load to be predicted; determining an error functional which is indicative of any undesired dips in the predicted force; calculating the parameters of the force elements which minimize the error functional, and coupling force elements having the calculated parameters to the coupler to make the actuator.

12 Claims, 14 Drawing Sheets

Freq = 5182.3 (cycles/time)

Freq = 14256. (cycles/time)

Freq = 27818. (cycles/time)

Symmetry axis

ACTUATOR

TECHNICAL FIELD

The invention relates to actuators, including planar moving coil actuators or piezoelectric actuators, more particularly but not exclusively actuators having one or more modal resonances in their operating frequency range.

BACKGROUND ART

Modal actuators employing a plate-like piezoelectric member that resonates in bending are discussed in WO01/54450. FIG. 1a shows a known modal moving coil actuator 10 which is symmetrical about its central axis and which is mounted to a circular panel diaphragm 12 by a coupler 14. The actuator comprises a magnet assembly and a voice coil assembly and is similar to the actuator described in pending UK application 0617551.7.

The magnet assembly comprises four pairs of coaxially mounted ring magnets 16,18,20,22 and a pair of low carbon steel cup plates 24,26. Each pair of magnets comprises an upper ring magnet mounted to the upper cup plate 24 and a lower ring magnet mounted to the lower cup plate 26. The upper and lower ring magnets in each pair are separated by an annular planar air gap into which the coil assembly is mounted.

The coil assembly comprises three voice coils 30, 32, 34 printed on a self-supporting annular planar substrate 28. The voice coils each apply a force (A, B or C respectively) to the substrate. Along its inner edge, the substrate 28 is clamped between the upper and lower cup plates 24,26. Since the actuator is inertial, an opposing force equal in magnitude to the sum of the three forces A, B and C, must be applied to the magnet assembly at this inner edge. At the outer edge, the substrate is attached to the coupler 14 and couples the actuator to the diaphragm whereby the power from the actuator is delivered to the diaphragm.

Since the substrate is not perfectly rigid, such modal actuators exhibit secondary or anti-resonances where almost no force is transmitted to a load. Accordingly, the force provided by such actuators varies with frequency to have nulls of force. For example, FIG. 1b shows the variation in force with frequency available at the coupler in FIG. 1a. The response is far from satisfactory due to a characteristic dip present at 6.5 kHz which is caused by an anti-resonance of the substrate. There are also peaks in the response but it is known that these may be minimised by adding damping.

It is an object of this invention to improve the transfer of force for any actuator, particularly modal transducers.

DISCLOSURE OF INVENTION

According to the invention, there is provided method of making an actuator comprising a plurality of force elements, the method comprising providing a coupler for coupling force from the force elements to a load; calculating a transfer function for each force element wherein the transfer functions allow the force provided to the load to be predicted; determining an error functional which is indicative of any undesired dips in the predicted force; calculating the parameters of the force elements which minimise the error functional, and coupling force elements having the calculated parameters to the coupler to make the actuator.

As set out above, an anti-resonance is a secondary resonance of the resonant element at which almost no force is transmitted to the load and thus, there is a dip or null in the force provided by an actuator at the frequency of these modes. By reducing excitation of these modes, the variation of force with frequency is reduced and a substantially more uniform force may be delivered to a load. If this load is a loudspeaker diaphragm, the resulting loudspeaker has improved efficiency and response uniformity compared to a loudspeaker in which the nulls of the driving actuator are not addressed. The results of the present invention are achieved structurally without the need for complex and costly feedback systems which have previously been proposed to address this problem.

The transfer function is a representation of the trend of force applied versus the force coupled to a load to be driven by the actuator. The transfer functions may be obtained directly by measurement, by numerical analysis such as finite element analysis, or by knowledge of a mathematical expression for the behaviour of the system. The resultant forces at a load driven by the actuator may be calculated from the transfer functions. The error function may provide a sum-squared error response derived from the parameters of the force distribution.

The parameters of the force elements may include their location on the coupler and the force applied by each force element.

The coupler may be in the form of a resonant element having a plurality of resonant bending wave modes in the operative frequency including at least one anti-resonance with the error functional being indicative of the presence of the at least one anti-resonance. The force elements may be located at or near the nodal lines of the at least one anti-resonance of the resonant element. In this way, the excitation of the at least one anti-resonance is at least minimised or may even be prevented. The resonant element and hence the actuator itself are preferably not radiating.

The force elements may be coupled to the resonant element at locations which suppress at least one of the second and third modes of the resonant element. For example, first and second force elements may be coupled to the resonant element on the nodal lines of the third mode and a third force element may be coupled to the resonant element on the nodal line of the second mode.

The resonant element may be in the form of a beam, a disc or an annular plate. For an annular plate, the force elements may be at relative locations 0.43, 0.56 and 0.69 along the radius of the resonant element. The resonant element may be clamped or supported at one end/edge and clamped or supported to a load at the opposed end/edge. The boundary conditions of the resonant element are important when determining the transfer functions. For example, for at least an end clamped condition, such an actuator may work down to dc (direct current). Such an actuator may provide the optimal solution for the distribution of force over the extent of the resonant element in order to maximise force delivered at the drive end and to minimise bending of the resonant element itself.

The force applied by each force element may be different, whereby the summed output to the load tends towards being monotonic with frequency, i.e. the force is of equal magnitude, with no nulls in the frequency response. The actuator may further comprise a coupler which sums the forces acting on the resonant element and transmits the summed force to a load to be driven. For an annular or circular resonant element, the force applied by each force element may be in proportion to the radii of their associated nodes. For example, for an actuator having three force elements, the relative values of the force applied by each element may be 0.646, 0.732 and 0.215. This tailoring of the distribution, in location and/or strength, of forces acting on the resonant element may increase the usable bandwidth of the actuator.

According to another aspect of the invention, there is provided an electromagnetic actuator made according to the method detailed above. The electromagnetic actuator may comprise a magnet assembly having a plurality of magnets and a voice coil assembly having a plurality of voice coils which are supported on the coupler and which cooperate with the magnets to form the force elements. The coupler may be circular or annular and the voice coils may be concentrically mounted on the coupler. For a coupler in the form of a resonant element, the location of the voice coils on the substrate may be such that at least one of the second and third modes of the resonant element is not driven. The actuator may comprise three voice coils with the inner and outer voice coils located on the nodal lines of the third mode and the middle voice located on the nodal line of the second mode. The voice coils may be mounted at relative locations 0.43, 0.56 and 0.69 along the radius of the resonant element.

As set out above, the magnitudes of each force preferably sum to give the correct net force. For an actuator having three voice coils, the force applied by inner voice coil may be set to a suitable available value and the inner and outer forces set to balance the summed output force. The outer force may be less than the inner force. For example, the forces may 0.05 N for the outer voice coil, 0.17 N for the centre voice coil and 0.15 N for the inner voice coil.

The magnet assembly may further comprise a pair of pole pieces. The magnets may be ring magnets which may be coaxially mounted about a central axis of the actuator. The magnets may have a trapezium shaped cross-section and the long parallel side of the trapezium may be mounted to one pole piece. The coupler may be a substrate such as printed circuit board on which the voice coils are printed. The printed circuit board may also carry additional electronics.

According to another aspect of the invention, there is provided a piezoelectric actuator made using the method described above. The piezoelectric actuator may comprise a plurality of electrodes which form the force elements. Each electrode may apply a different force or weight to the resonant element.

For a piezoelectric actuator, the parameters of the force elements may additionally include the division points between the electrodes and the number of electrodes.

The actuator may be a unimorph having a single layer of piezoelectric material. The plurality of electrodes may be defined in a single layer of piezoelectric material by removing piezoelectric material using patterning. Alternatively, the plurality of electrodes may be defined by applying different voltages to different areas of the piezoelectric layer.

The piezoelectric actuator may comprise three electrodes each having the weights 0.8, 0 and −0.6. The coupler may be in the form of a beam and may be clamped at one edge and clamped to a load at the opposed edge The coupler may be in the form of a central vane sandwiched between two piezoelectric layers, wherein each piezoelectric layer comprises at least two electrodes which form the force elements. Thus, according to another aspect of the invention, there is provided a bimorph actuator comprising a central vane sandwiched between two piezoelectric layers, wherein each piezoelectric layer comprises at least two electrodes forming the force elements of the actuator described above.

The parameters of the at least two electrodes may comprise the location of the division(s) between the electrodes and the voltage applied to each electrode. A voltage may be applied to only one electrode in each layer or an equal and opposite voltage may be applied to adjacent electrodes.

A peak from the second mode may be suppressed by setting the division between two electrodes at 0.471 of the normalised length of the piezoelectric layer and applying a voltage to only one electrode in each layer. If the loss in level due to the missing electrode is unacceptable, the other electrode may be fed with the output of a notch filter tuned to the right frequency. Alternatively, a peak from the second mode may be suppressed by setting the division between two electrodes at 0.625 of the normalised length of the piezoelectric layer and applying an equal and opposite voltage to each electrode in each layer.

By co-operatively selecting both the division and the ratio of voltages applied to each electrode, two modes may be suppressed. For example, peaks from the second and third mode may be suppressed by setting the division between the electrodes at 0.355 of the normalised length of the piezoelectric layer and setting the voltage ratio to be 1:0.244.

In any embodiment (particularly piezoelectric), the actuator may have a low profile and may have a depth as low as 3.5 mm. Such a design is suitable for incorporating into greetings cards, packaging and novelty applications. The actuator may be inertial, i.e. not-grounded to a frame or other support. In other words, the actuator may be free to vibrate or to bend and so generate a force via the inertia associated with accelerating and decelerating its own mass during vibration.

In any embodiment the actuator may further comprise damping means to reduce any peaks in the frequency response. Alternatively, the input to the actuator may be attenuated to reduce any peaks in the frequency response. For example, for a bimorph actuator comprising two piezoelectric layers sandwiching a central vane, there are several ways of suppressing at least one mode. These techniques for suppressing modes may used in conjunction with the techniques for suppressing any anti-resonances described above or alone.

According to another aspect of the invention, there is provided a loudspeaker comprising a radiator and an actuator as previously described mounted to the radiator to excite the radiator to produce a sound output. The radiator may be a panel which may be capable of supporting resonant bending wave vibration.

BRIEF DESCRIPTION OF DRAWINGS

The invention is diagrammatically illustrated, by way of example, in the accompanying drawings in which:—

FIG. 1b is a graph of blocked force against frequency for the actuator of FIG. 1a;

FIGS. 2a to 2c are schematic diagrams of the first three modes of an actuator according to FIG. 1a;

FIG. 3b is a graph of blocked force against frequency for the actuator of FIG. 3a;

FIG. 3c is a graph of sound pressure against frequency for a loudspeaker incorporating the actuator of FIG. 3a;

FIGS. 4b and 4c show the first two modes of the actuator of FIG. 4a;

FIGS. 5b to 5d show the displaced shapes at 20 kHz for inner, middle and outer electrode rings of the actuator of FIG. 5a;

FIG. 6b is a sample output for two variation of the force generator of FIG. 6a;

FIGS. 7b and 7c show the first four mode shapes for the force generator of FIG. 7a;

FIG. 7d is a graph of resultant output force against frequency for specimen transfer functions for the force generator of FIG. 7a;

FIG. 7e is a graph of resultant output force against frequency for specimen transfer functions with optimised weightings for the force generator of FIG. 7a;

FIG. 7g shows the variation in torque output with frequency for the optimised force generator of FIG. 7a;

DETAILED DESCRIPTION OF DRAWINGS

Figure 1A:
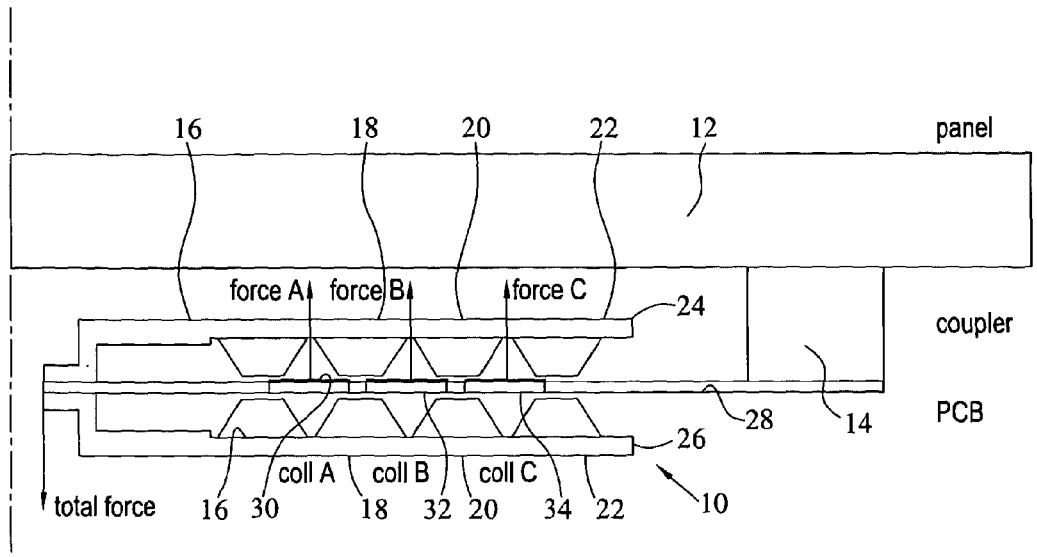
FIG. 1a is a schematic partial cross-section of a known flat actuator.
Figure 1B:
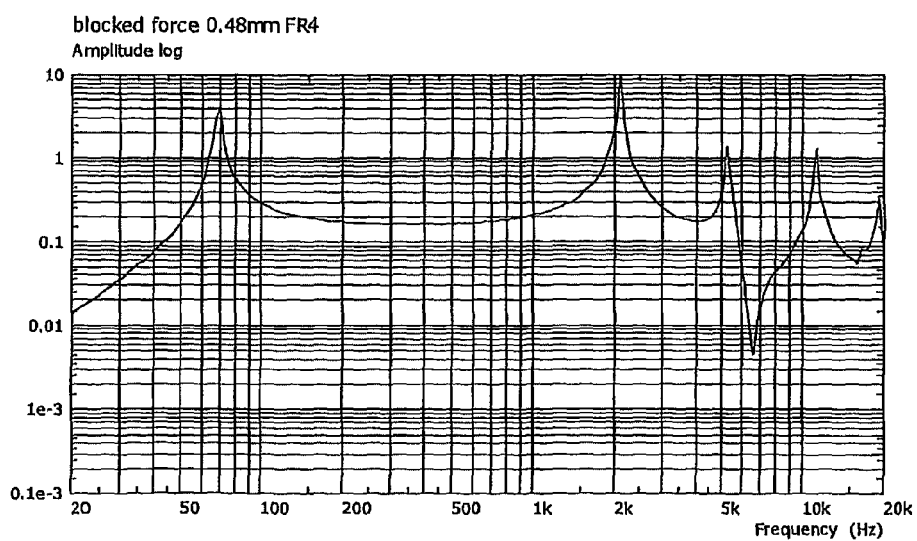
Figure 2A:
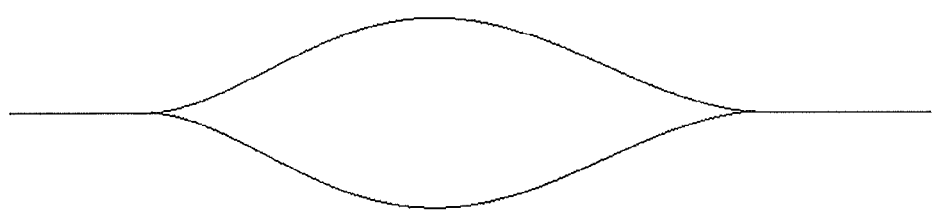
Figure 2B:
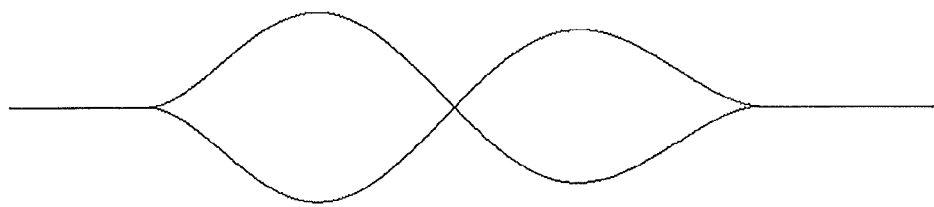
Figure 2C:
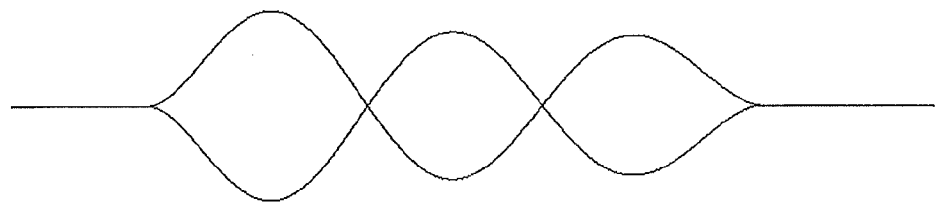

FIGS. 2a to 2c show the shapes for the first three modes of the substrate of FIG. 1a calculated using an axisymmetric FEA model. These three modes cover the operating frequency range up to 27.8 kHz so no more modes need be considered. When determining the shapes of these modes, the nature of the boundary conditions for the substrate is critical. At its inner most edge, the substrate is clamped to the magnet assembly and is effectively prevented from rotation. At its outer edge, the substrate is fixed to the panel by a rigid connector which at low frequencies may also be considered to have no rotation (at high frequencies nothing is rigid and the panel and connector both displace and rotate). Accordingly, the boundary conditions are the same for the inner and outer edges of the substrate.

Figure 2D:
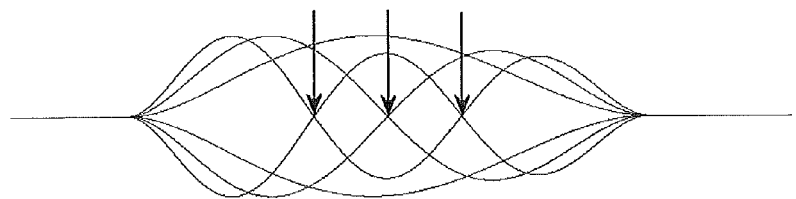
FIG. 2d is a schematic drawing showing the location of the voice coils in an actuator according to the invention.

In FIG. 1a, the voice coils are uniformly distributed with radius. Accordingly, each of the first three modes is driven to some degree which results in the unacceptable dip in the force. The first mode will always be driven because the actuator is inertial (i.e. has no external ground reference). The first mode is an integral part of its behaviour. Accordingly, the location of the voice coils relative to the second and third modes needs to be carefully selected. Positioning the inner and outer voice coils so that the generated forces coincide with the nodal lines of the third mode ensures that this mode is not excited. Furthermore, the nodal lines of the third mode are equally spaced either side of the nodal line for the second mode. Accordingly, the inner and outer voice coils will not drive the second mode. The middle coil is set at the nodal line of the second mode to avoid exciting this mode. FIG. 2d shows the position of the resulting three forces.

Figure 3A:
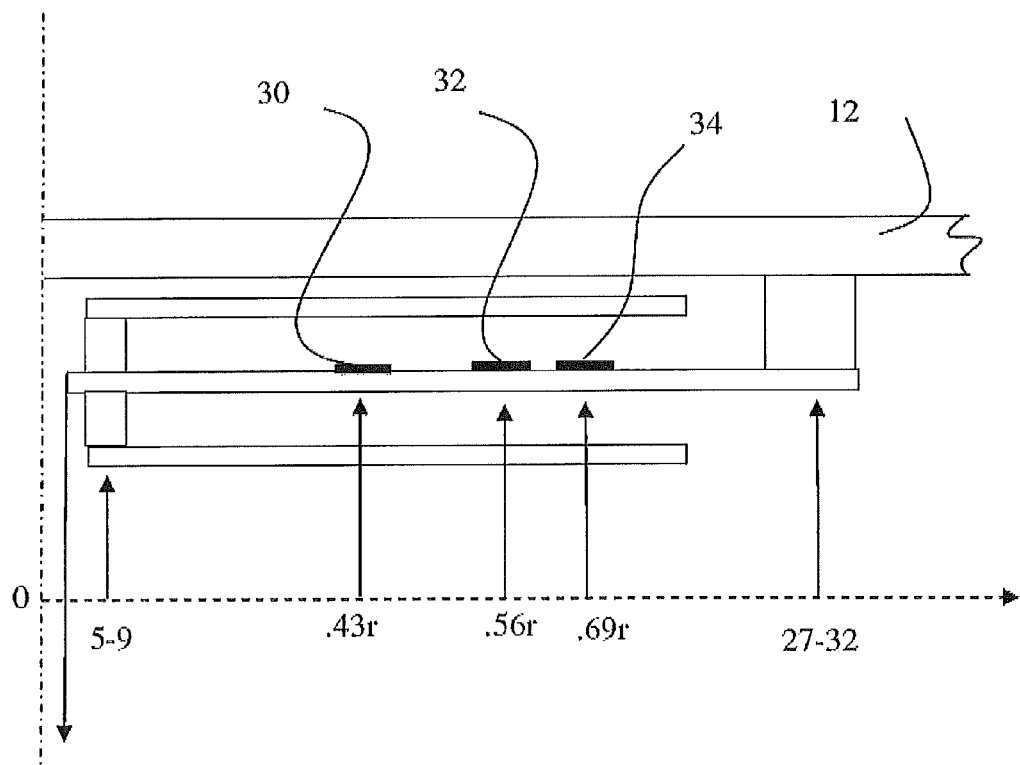
FIG. 3a is a schematic partial cross-section of a flat actuator according to the invention.

FIG. 3a shows an actuator which is similar to that of FIG. 1a except that the locations of the voice coils have been selected according to the invention. The location of the inner and outer radial position of each voice coil 30, 32, 34 on the coupler substrate 28 is set out in the table below together with the inner and outer radial positions of the connector 14 and the clamp provided by the upper and lower pole plates 24,26. The location of the midpoint of each coil as a percentage of the radius of the panel is also shown. The magnets 16, 18, 20, 22 at the revised coil positions are omitted for clarity.

| | radial positions (mm) | | |
|---|---|---|---|
| Feature | inner | outer | Midpoint % |
| Clamp | 5 | 9 | |
| Inner coil (30) | 12.05 | 15.53 | 0.43 |
| Centre coil (32) | 16.27 | 19.75 | 0.56 |
| Outer coil (34) | 20.46 | 23.94 | 0.69 |
| Coupler (14) | 27 | 32 | |

Figure 3B:
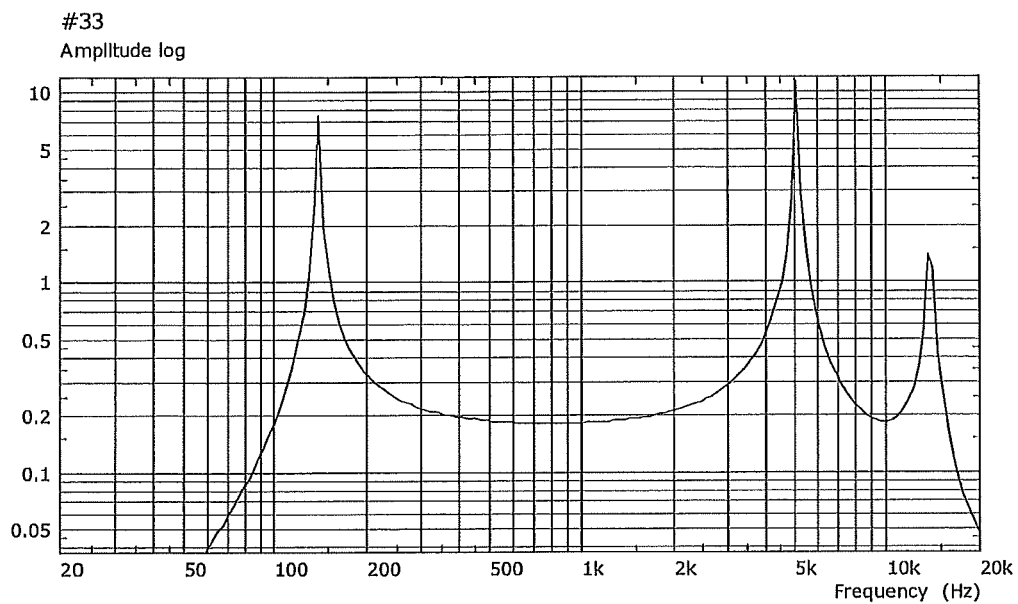

FIG. 3b shows the variation of force with frequency for the actuator of FIG. 3a. Notice that there are now no dips in the response. However, there are two significant visible peaks at 5 kHz and 13 kHz which may be equalised by considering the magnitude of each force.

Having located the forces it is also necessary to ensure that the magnitudes of each force sum to give the required net force. The central force drives both the first and third modes at their respective anti-nodes and thus may be set at an arbitrary value. However, the inner and outer forces need to be adjusted because of the effect of the boundary conditions on the substrate. The boundary conditions are defined by the need to extract the force from the outer edge of the substrate and also the coupling of the inner edge to the overall magnet mass. In practice the inner force is set to a suitable available value and the outer force adjusted to balance the summed force. The outer force is usually less than the inner force, but this will depend on the boundary conditions present. For example, the forces may be set as:

| location | Force (N) |
|---|---|
| Outer force (C) | 0.05 |
| Centre force (B) | 0.17 |
| Inner force (A) | 0.15 |

Figure 3C:
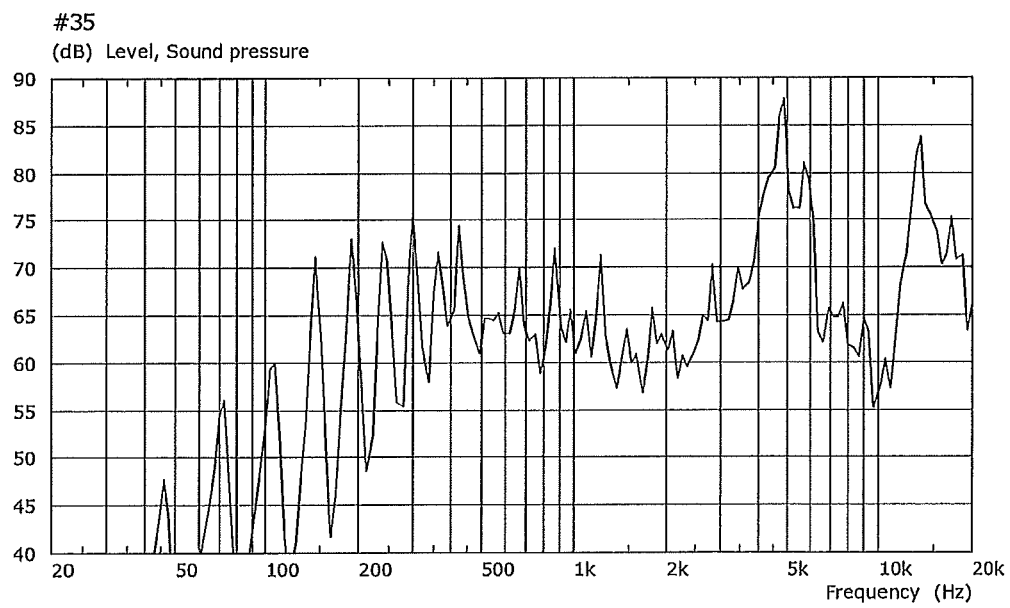

FIG. 3c shows the calculated acoustic output for a loudspeaker comprising a large circular panel diaphragm to which is coupled the actuator of FIG. 3a having the balance of forces set out above. The results were extracted for sound pressure at 1 meter on-axis and show the beneficial effect of the balanced drive.

Figure 4A:
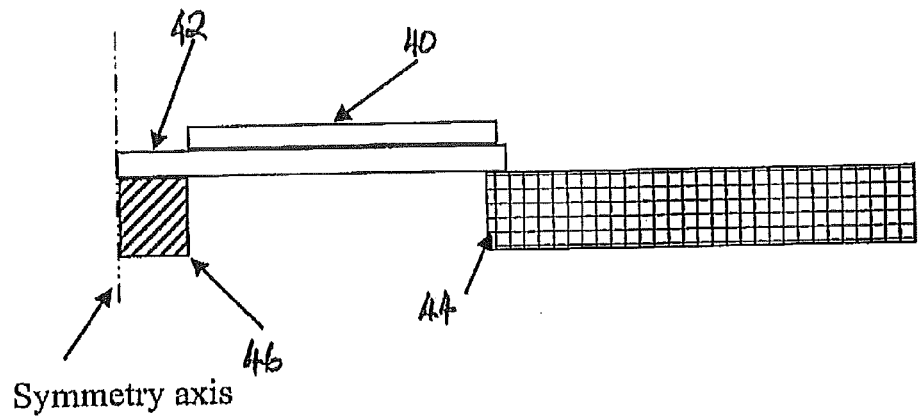
FIG. 4a is a schematic partial cross-section of a second known actuator.
Figure 4B:
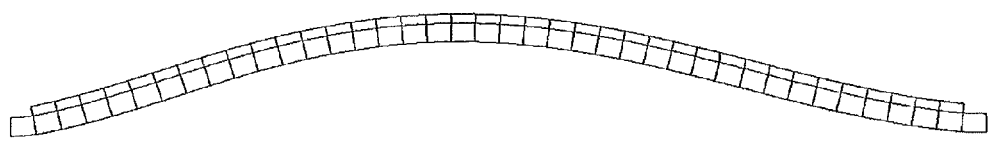
Figure 4C:
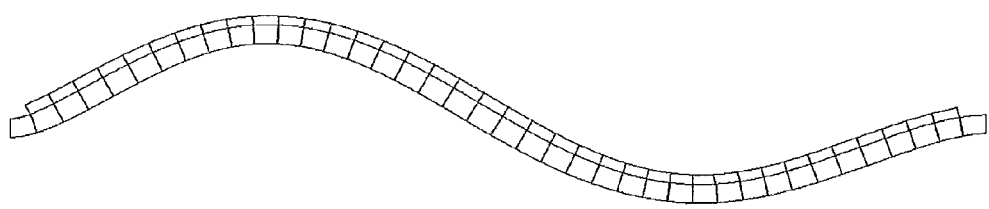

FIG. 4a shows a unimorph piezoelectric actuator comprising a single annular layer 40 of piezoelectric material mounted to a circular substrate 42 which forms the coupler, in this case resulting in a resonant element. The edge of the piezoelectric layer is mounted to a load in the form of a panel diaphragm 44. A circular mass 46 is loaded to the centre of the circular substrate 42. By taking the force from the edge or periphery of the actuator, there is a null in the frequency response which is addressed by the teaching of the invention. Alternatively, the actuator may be mass loaded at its edge and coupled to a load at its centre FIGS. 4b and 4c show the first two modes of the actuator of FIG. 4a. These modes have been obtained based on the following model:

Outer diameter of actuator—25 mm
Thickness of the nickel-iron substrate 42-200 um
Thickness of the piezoelectric layer—100 um The latter thickness is probably greater than typical for such devices, hence the mode frequencies are quite high.

The precise frequencies of the modes depend upon the electrode pattern on the piezoelectric layer. The piezoelectric material is effectively more compliant in the region absent of an electrode because this allows it to develop surface charges when operative. In FIG. 4a, the piezoelectric layer is a single constant layer applying one force to the substrate.

Figure 5A:
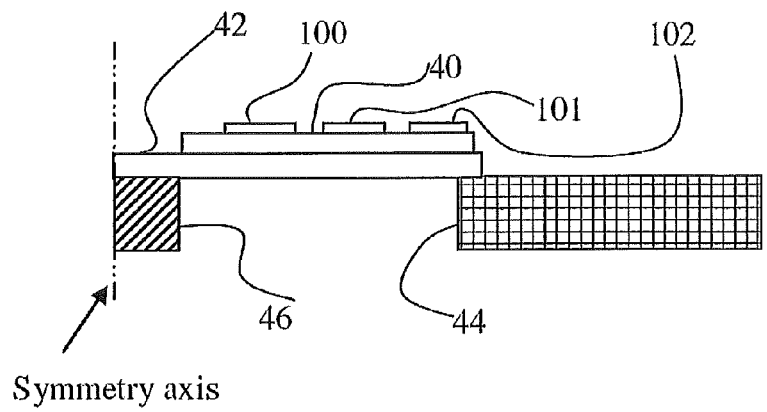
FIG. 5a is a schematic partial cross-section of a second actuator according to the invention.

In FIG. 5a, the piezoelectric layer comprises a single layer of piezoelectric material having three separate ring electrodes 100, 101, 102 which form the multiple force elements acting on the coupler which is a resonant substrate. The location of these force elements may be selected to achieve a desired output force. When all three electrodes are driven at the same voltage 1V, the graphs of blocked force and blocked torque against frequency are very similar to the same graphs for a single electrode piezoelectric layer also driven at 1V. Both sets of graphs exhibit deep nulls in the force response at about 3 kHz.

Figure 5B:
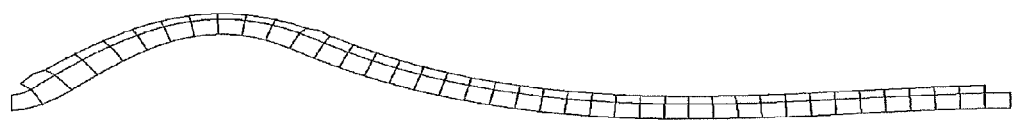
Figure 5C:
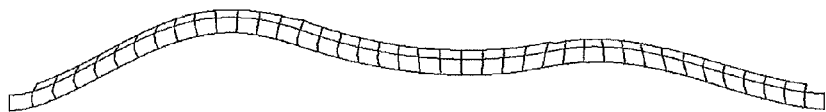
Figure 5D:
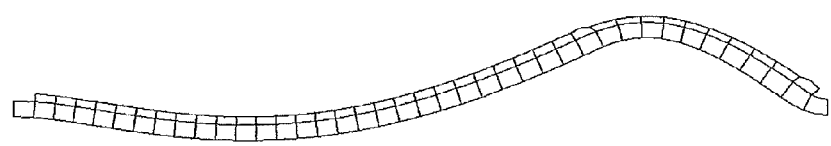
Figure 5E:
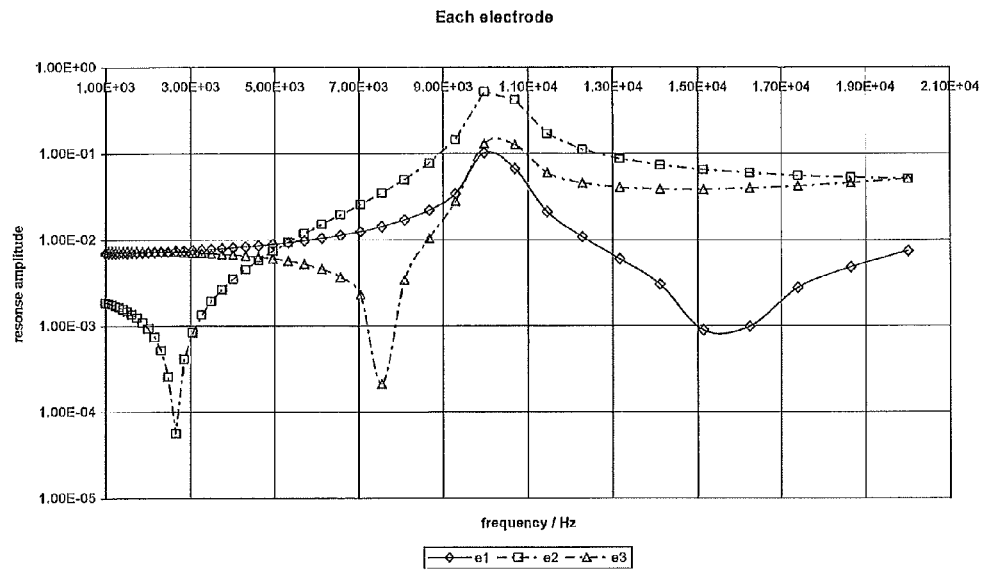
FIG. 5e shows the individual transfer function amplitudes for each of the electrodes of FIGS. 5b to 5d.

In applying the invention, the first step is to determine the individual transfer functions from input to output. FIGS. 5b to 5d show the displaced shapes at 20 kHz for inner 100, middle 101 and outer 102 electrode rings. FIG. 5e shows the individual transfer function amplitudes for each of the electrodes. Each electrode has its own null-point and there is a peak corresponding to the mode at about 10 kHz. When the real part of the response is examined, it is seen that all the responses have a sign change at the mode. However, each response has an additional sign change at some other frequency as well. It is the sign-change in the response of the middle electrode at 2.7 kHz which causes the dip in the summed response at 2.8 kHz.

The three transfer functions are fed into an error function, S0, designed to minimise the effect of the 3 kHz dip. This function S0 has three stationary values, one of which is a local maximum and is to be discounted. The real-only error matrix, its eigenvalues and eigenvectors are set out below. The real only error matrix separates the stationary values better.

| Real error matrix S0 | | | Eigenvalues of S0 | Eigenvectors of S0 | | |
| --- | --- | --- | --- | --- | --- | --- |
| 1.7640 | −8.1138 | 0.9659 | 39.6142 | 0.2110 | 0.9164 | −0.3402 |
| −8.1138 | 37.3214 | −4.4426 | 0.0000 | −0.9706 | 0.1553 | −0.1837 |
| 0.9659 | −4.4426 | 0.5291 | 3.2904e−4 | 0.1155 | −0.3690 | −0.9222 |

The table shows that the vector with the highest eigenvalue is dominated by the middle ring electrode e2, which is the main cause of the 3 kHz dip. The other two eigenvectors are dominated by the inner electrode e1 or the outer electrode e3, the former giving a better result.

Figure 5F:
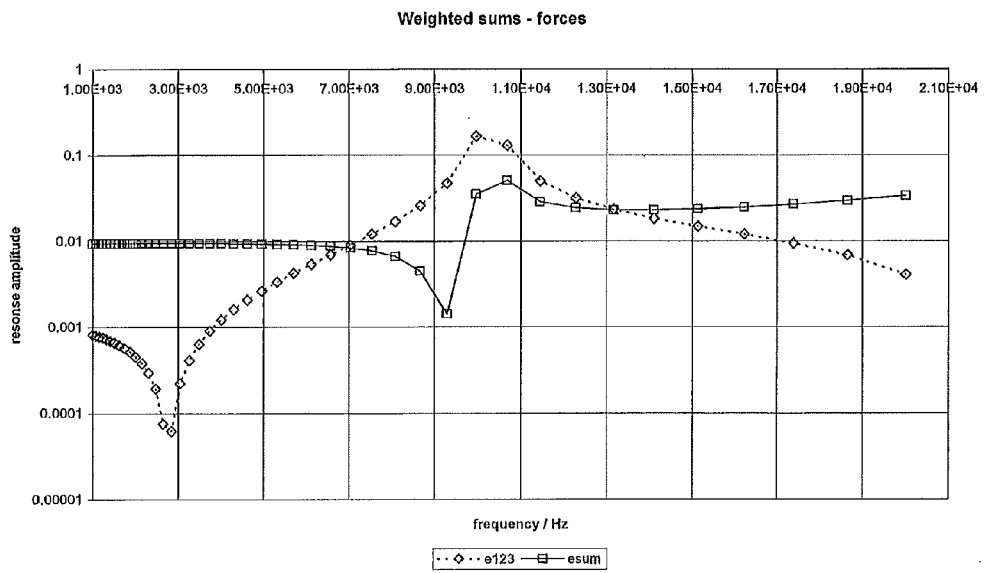
FIG. 5f shows the variation in summed force against frequency for the actuator of FIG. 5a with equal (e123) and S0 optimised weights (esum)

For the electromagnetic actuator, varying the force applied by each force element improved the result further. Accordingly, the same principle is applied to the piezoelectric actuator. As shown in FIG. 5f, the use of optimized weights of (or forces applied by) electrodes (approximately 0.8, 0, −0.6) eliminates the null at 3 kHz, leaving only a small fluctuation at about 9 or 10 kHz.

To try and improve this result, a new error S1 estimate is created based on the torque response at 10 kHz. This matrix, its eigenvalues and its eigenvectors are shown below:

| Real error matrix S1 | | | Eigenvalues of S1 | Eigenvectors of S1 | | |
| --- | --- | --- | --- | --- | --- | --- |
| 0.4396 | −2.4143 | 0.6508 | 14.6629 | 0.1731 | 0.7991 | −0.5757 |
| −2.4143 | 13.2600 | −3.5740 | 0.0000 | −0.9510 | −0.0165 | −0.3089 |
| 0.6508 | −3.5740 | 0.9634 | 5.1433e−5 | 0.2563 | −0.6010 | −0.7570 |

Figure 5G:
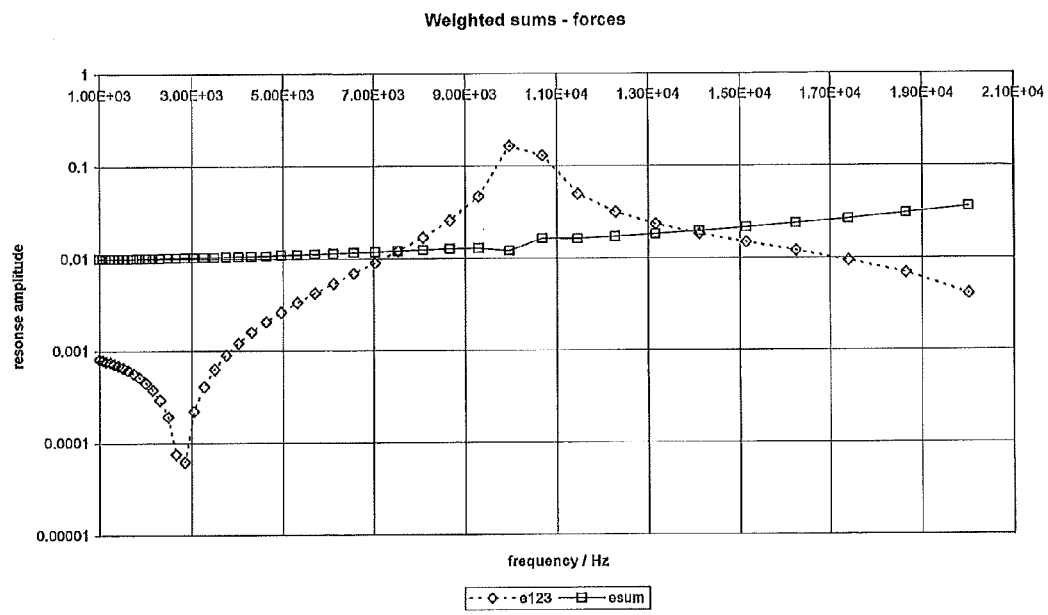
FIG. 5g shows the variation in summed force against frequency for the actuator of FIG. 5a with equal (e123) and S1 optimised weights (esum)

As before, the matrix similarly discriminates between the middle electrode e2 and the others. FIG. 5g shows the use of the optimised weights derived from S1 produces very good results in the summed force. Similarly the results for blocked torque are good.

It is noted that the use of tabulated results may be misleading since it is possible to merely move the null to half-way between two sampling points rather than eliminate it. However, in the example above, it is believed that the sampling is fine enough for the nulls to appear on more than one sample.

Figure 6A:
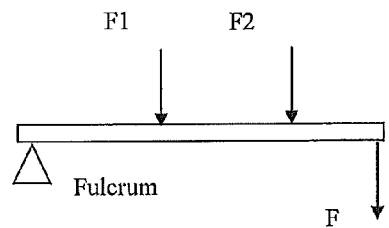
FIG. 6a shows a side view of a lever modal force generator.

As described above, the output of a modal force generator generally has both poles (peaks in the response) and zeros (nulls in the response). The poles are treatable via damping or by attenuating the input. FIG. 6a onwards show the general theory for addressing the nulls which is applied to the practical examples described above.

FIG. 6a shows a coupler in the form of a simple lever 50 to which two forces F1 and F2 are applied. At low frequencies, the output force, F, is easily calculated from the inputs, F1 and F2, and the distances from the fulcrum 52. At higher frequencies, however, there are phase-lags between the inputs and output, such that under certain conditions it is possible for the contributions of the inputs to cancel at the output.

Figure 6B:
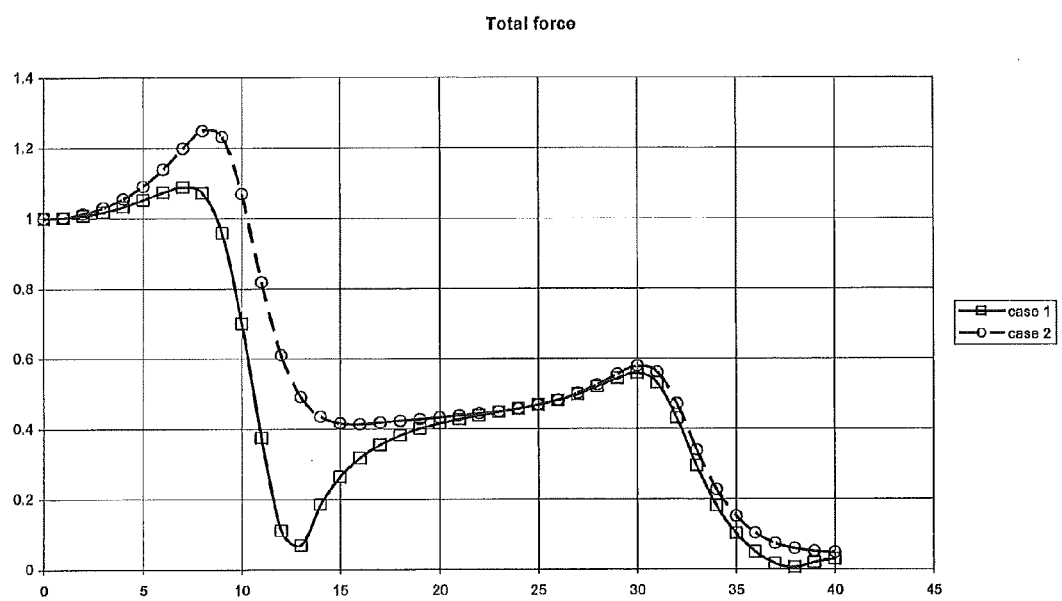

FIG. 6b shows two illustrative sample responses of the device of FIG. 6a. The x-axis is a frequency-like parameter (e.g. scaled frequency f/critical frequency or wave-number=2 pi/wavelength), and the y-axis is the summed output force. The response for case 1 shows a deeper null than that for case 2. A lever with a response like case 1 could be considered unusable at frequencies beyond 10 units. However, a lever with a response like case 2 could be usable up to approximately 30 units with moderate equalisation.

The present invention provides a systematic approach for improving a modal lever system such as that shown in FIG. 6a. The system may comprise an actuator in the form of a string, a beam, a disc or an annulus and may have a clamped or supported fulcrum and/or a clamped or supported load-point. Each system has a defining set of differential equations and boundary conditions. Furthermore, there exists a set of transfer functions from each input to each output. This set of transfer functions may be obtained directly by measurement, by numerical analysis such as finite element analysis, or by knowledge of a mathematical expression for the behaviour of the system.

The mathematical expression may be derived as follows:

Let the displacement mode-shapes of the system be given by Y(n,r), where r is the co-ordinate vector defining a position in the system, and n is the number of the mode. Let the corresponding modal frequency and damping factor be fn and ζn, respectively.

It is known from general literature that the response of the system due to a force acting at r0 may be described by a so-called Green's function G(r, r0), which specifies the response of the system at r due to stimulus at r0. This Green's function may be defined in terms of the system modes as $$G(\underline{r}, \underline{r0}) = \sum_n \alpha(n, \underline{r0}) Y(n, \underline{r}) \quad (1)$$

$$\alpha(n, \underline{r0}) \propto \frac{Y(n, \underline{r0})}{fn^2 - f^2 - j\zeta n fnf}$$

where the alpha terms represent the frequency dependent receptance of the system to stimulus at r0 for each mode.

It is a relatively straightforward step from here to consider a similar transfer function for the force resultant, for either discrete or continuous source distributions.

$$F(\underline{load}, \underline{r0}) = \sum_{sources} F_{source} \sum_n \alpha(n, \underline{source}) Q(n, \underline{load}), \text{ or} \quad (2)$$

$$F(\underline{load}, \underline{r0}) = \oint_S \int F(S) \sum_n \alpha(n, \underline{r(S)}) Q(n, \underline{load}) dS \quad (3)$$

Armed with equation (2) or (3), calculation of the coefficients of the minimisation matrix is a routine matter.

Equipped with the transfer functions, it is possible to predict the resultant forces at the load. If this is calculated with a uniform distribution of forces, it is likely that the response will have nulls. A functional is developed, designed to indicate the presence of these nulls. It takes as input parameters the force distribution, and provides a sum-squared error response.

$$SSE = W(F1, F2, \ldots, Fn)$$

A minimisation procedure is applied to this functional using variational methods, to find the parameter values which minimise its value.

$$\delta(W)=0, \text{ i.e. } dW/dF1 = dW/dF2 \ldots = dW/dFn = 0$$

These n equations form a set of simultaneous equations, but as all these equal zero, the system is classed as redundant.

$$S \times F = 0, \text{ hence } |S| = 0$$

Where S is a matrix of coefficients for dW/dF, and F is the vector (F1, F2 ... Fn).

This problem is very similar to the eigenvalue problem which seeks to find solutions to the equation A.x–λ.x=0, where A is a matrix, λ is an eigenvalue and x is the associated eigenvector. When there are duplicate eigenvalues, the system is said to be degenerate. When this is the case, there are an infinite number of possible eigenvectors. For example, if x1 and x2 are possible eigenvectors for a common eigenvalue λ, the any linear combination of x1 and x2 will also satisfy the equation.

Returning to the minimisation problem, if there are m exact solutions to the minimisation problem, S will have m zero eigenvalues. If there are no exact solutions, then the best solution will have the lowest eigenvalue. It is this flexibility for finding non-exact solutions that makes the invention so powerful.

Figure 7A:
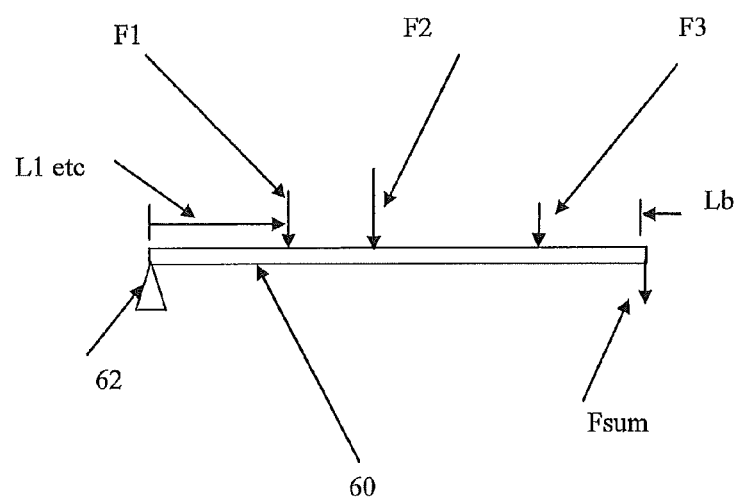
FIG. 7a is a partial cross-section of a modal force generator according to the present invention.

FIG. 7a shows an example system comprising a coupler in the form of a ring-shaped plate 60 clamped at its inner edge to a fulcrum 62 and clamped at its outer edge to a load (not shown). Multiple forces F1, F2 and F3 are applied and delivered along circular lines, so the system exhibits axis-symmetry. These forces are summed as Fsum at the outer edge of the plate 60. The inner radius of the plate is ⅓ of the outer radius.

Figure 7B:
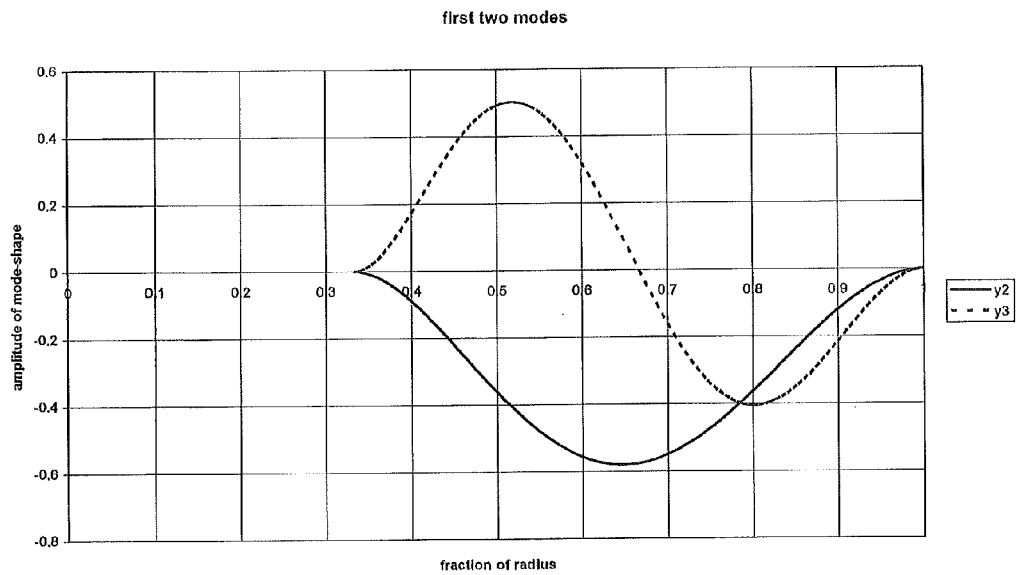
Figure 7C:
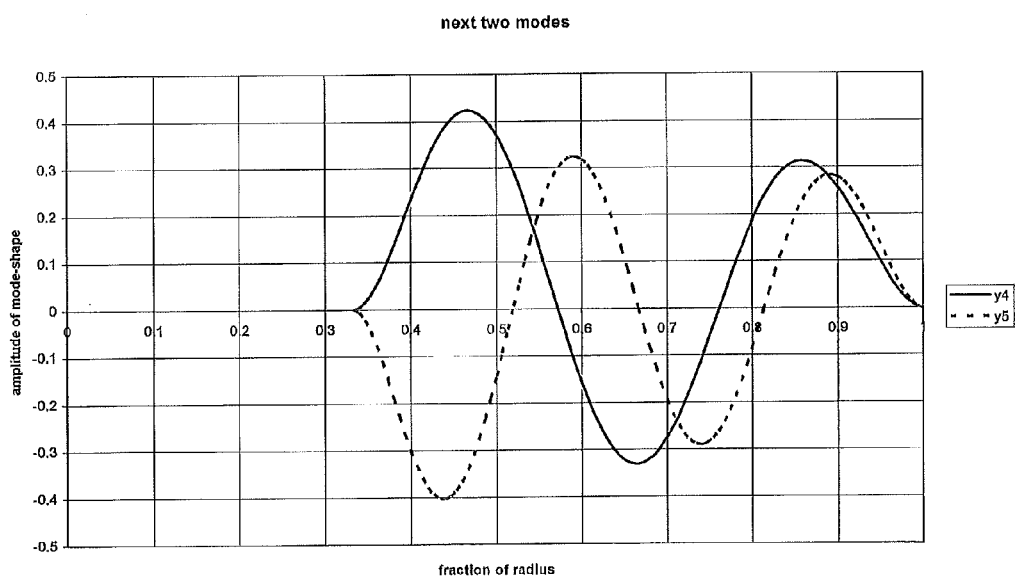

In this case, the system is simple enough to solve directly using analytical methods. The mode shapes comprise linear combinations of Bessel functions. FIGS. 7b and 7c together show the first four modes with the curve names "y2","y3" etc referring to the number of nodal lines of each mode. The eigenvalues for these four modes are 7.07, 11.76, 16.48 and 21.19. The corresponding frequencies for the chosen plate material are 4.34 kHz, 11.98 kHz, 23.53 kHz and 38.92 kHz.

Examining the mode shapes, it may be seen that y3 and y5 have an almost coincident nodal line at ⅔ of the outer radius. Possible additional drive points would be at, or near, the other nodes of mode y5. Let us number these three drive points with increasing radius from 1 to 3.

Figure 7D:
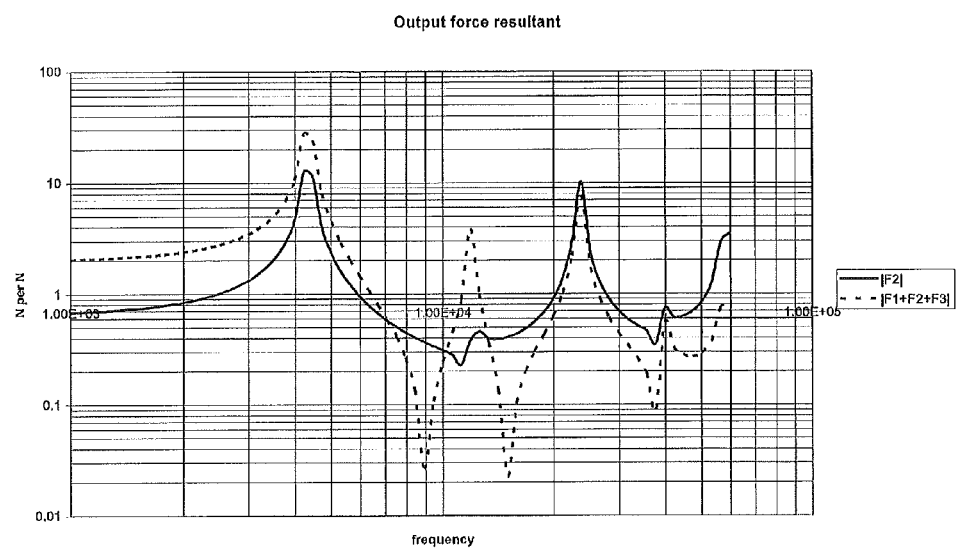

The transfer function for a single drive at node 2 is shown by the solid curve in FIG. 7d. It may be seen that there are peaks corresponding to modes y2 and y4, but not at y3 or y5. The transfer gain at low frequencies is about 0.7. In an attempt to increase the force without overloading drive-point 2, equal forces per unit length were added at drive-points 1 and 3. The resulting force transfer function is shown by the broken curve in FIG. 7d.

As desired, the total force delivered at low frequencies has increased, but because of phase differences in the individual transfer functions, there are undesirable deep notches at about 9 kHz and about 15 kHz. Now we would like to choose a set of input force values that give a better response. Taking our lead from this response curve, we would like to define our cost function in two stages, thus;

$$SE1 = (|F(1 \text{ kHz})| - |F(9 \text{ kHz})|)^2,$$

$$SE2 = (|F(9 \text{ kHz})| - |F(15 \text{ kHz})|)^2,$$

Where F=a.F1+b.F2+c.F3;

F1, F2 and F3 are the individual force transfer functions and the parameters a, b and c are the input force values.

This error function is non-linear in the parameters, making the solution difficult. Furthermore, it is noted that the force transfer functions may change sign at a mode. In particular, the resultant may be expected to flip at each mode, meaning that F(9 kHz) is of opposite sign to F(1 kHz) and F(15 kHz). Accordingly, the error functionals may be rewritten as:

$$SE1 = (F(1 \text{ kHz}) + F(9 \text{ kHz}))^2,$$

$$SE2 = (F(9 \text{ kHz}) + F(15 \text{ kHz}))^2,$$

If a, b and c have complex values, it is found that both SE1 and SE2 have two exact stationary points as shown in the following table which shows the possible drive weights for an annular ring system:

| Drive point | SE1-1 | SE1-2 |
|---|---|---|
| 1 = a | 0.8982 | −0.1380 + 1.6371e − 4i |
| 2 = b | 0.0683 − 1.3285e − 3i | 0.9656 |
| 3 = c | 0.4343 − 7.2786e − 3i | −0.2203 + 8.1869e − 4i |

Figure 7E:
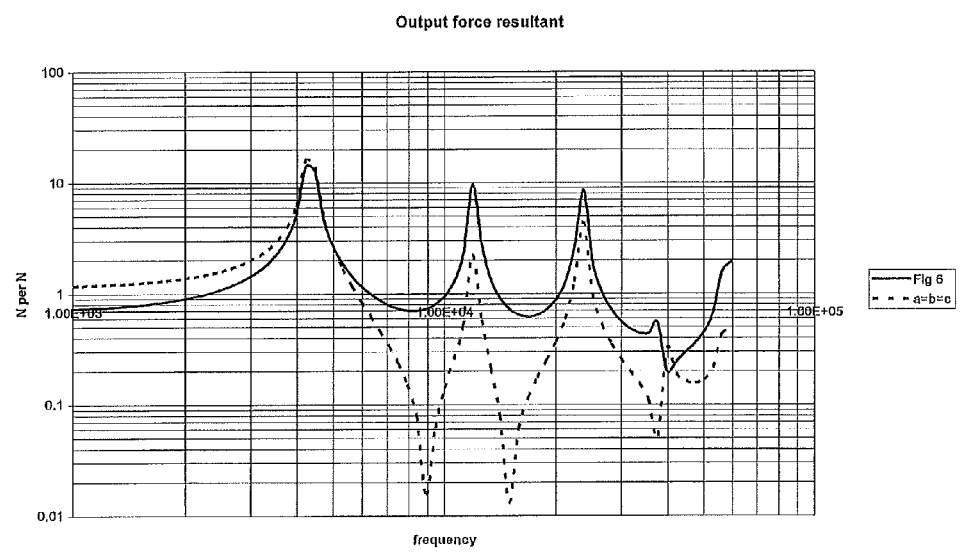

(See FIG. 7e)

Any linear combination of the two has one exact stationary point.

If a, b and c must have only real values, it is found that both SE1 and SE2 have one exact stationary point as shown in the following table which shows the possible drive weights for an annular ring system:

| Drive point | SE1 bias | SE2 bias | complex |
|---|---|---|---|
| 1 = a | 0.8683 | 0.8655 | 0.8680 |
| 2 = b | 0.3186 | 0.3213 | 0.3169 + 0.0376i |
| 3 = c | 0.3803 | 0.3843 | 0.3802 − 0.0133i |

Figure 7F:
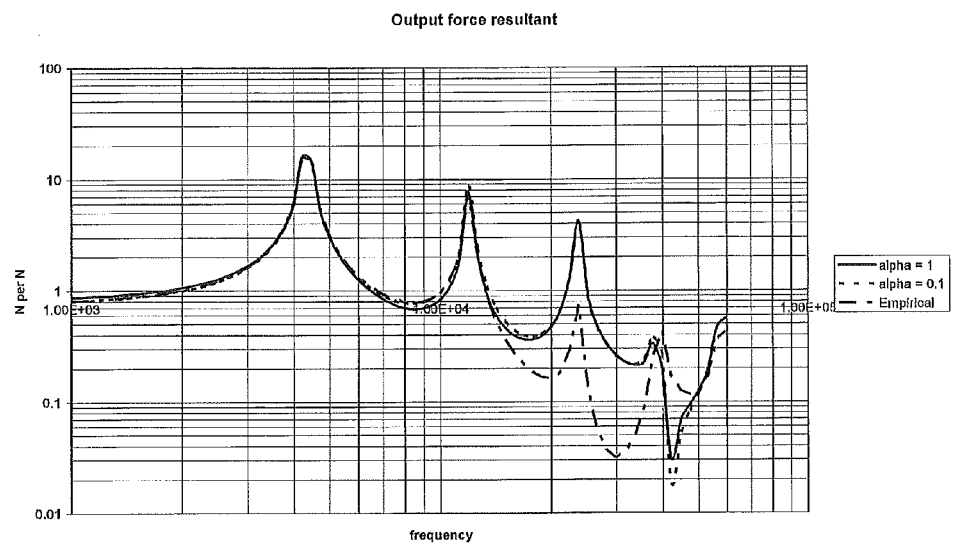
FIG. 7f is a graph of resultant output force against frequency for specimen transfer functions with alternatively optimised weightings.

Any linear combination of the two has one approximate stationary point, which depends weakly on the relative weighting of SE1 and SE2. As the results are in the form of an eigenvector, the values are normalised such that the sum of the squared moduli of the weights is unity. It can be seen that the three results are very similar. FIG. 7f shows the response with these optimised weightings where it may be seen that the notches have been completely removed.

Returning to the two sets of drive weights where a, b and c may be complex, it is of note that one set is dominated by the presence of drive 2, and the other is dominated by its absence. This confirms that point 2 would be a sensible place to drive. It also suggests that one way to further optimise the system would be to fix b, then to vary a and c to balance the low and mid sensitivities. This empirical process was conducted, using a finite element model as the tool. Setting b to unity, it was found that a=0.882 and c=0.294 gave a useful response. When normalised, these values become 0.646, 0.732, 0.215 respectively. The resulting force transfer function is plotted in FIG. 7e.

A systematic approach to this additional optimisation is developed below. Common engineering sense would suggest that a force distribution that followed the natural tendency towards uniform pressure would be likely to be most efficient. This translates to setting the weights a, b and c in proportion to the radii of their associated nodes. One possible error function to measure deviation from this natural balance is as follows:

$$SE3 = \frac{(a\rho_2 - b\rho_1)^2 + (b\rho_3 - c\rho_2)^2 + (c\rho_1 - a\rho_3)^2}{\rho_1^2 + \rho_2^2 + \rho_3^2}$$

The associated matrix is $$S3 = \frac{1}{\rho_1^2 + \rho_2^2 + \rho_3^2} \begin{pmatrix} \rho_2^2 + \rho_3^2 & -\rho_1\rho_2 & -\rho_1\rho_3 \\ -\rho_1\rho_2 & \rho_1^2 + \rho_3^2 & -\rho_2\rho_3 \\ -\rho_1\rho_3 & -\rho_2\rho_3 & \rho_1^2 + \rho_2^2 \end{pmatrix}$$

Where the various ρ values are the radii of the respective drive-points. A new eigenvalue problem is formulated using S=a.S3+S1 to give a family of solutions.

| Drive point | α = 1 | α = 0.5 | α = 0.1 | Empirical set |
|---|---|---|---|---|
| 1 = a | 0.7281 | 0.7459 | 0.7602 | 0.6460 |
| 2 = b | 0.5857 | 0.5819 | 0.5787 | 0.7324 |
| 3 = c | 0.3561 | 0.3241 | 0.2953 | 0.2153 |

The system responses to some of this family of solutions are shown in FIG. 7f. It may be seen that the parameter alpha serves to trade-off the low frequency and high frequency sensitivities. The formally optimised values perform better than those obtained in a more empirical fashion. The useful 3 dB bandwidth was extended from about 6.5 kHz for an simple force distribution to about 28 kHz for the various optimal solutions.

Figure 7G:
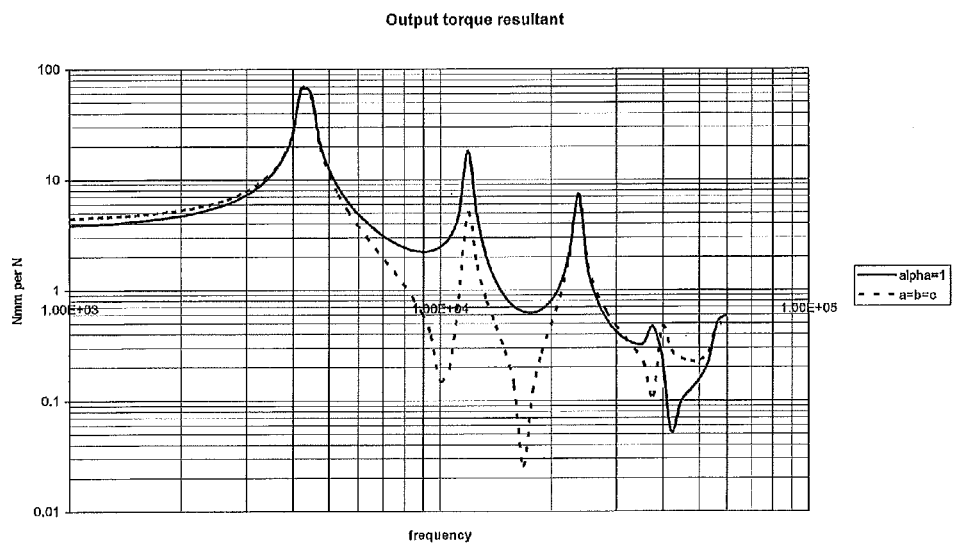

The annular plate system is a good example of one with multiple outputs. As well as producing a simple force at the output, it also generates a torque. FIG. 7g shows that the method has simultaneously had a beneficial effect on this auxiliary output.

The method for improving the actuator performance according to the invention is very flexible, allowing for example the setting of additional goals. Furthermore, as demonstrated above, the method is robust, providing ranges of values with similar responses. A useful side-effect of the method is that it provides insight into which force distributions may be considered fundamental to the system. The weights for these force distributions will be largely independent of other system weights—for example, drive-point 2 in the example of FIG. 7a.

With the embodiments described above, it is clear where to place a force so as not to drive a particular mode, namely at its node. In the following embodiment, a bimorph piezoelectric actuator having a coupler in the form of a central vane sandwiched between two piezoelectric layers is considered. With such an actuator, the force is implicit as a bending moment is directly applied and thus it is not at first sight obvious where to place an electrode so as not to drive a particular mode.

Figure 8A:
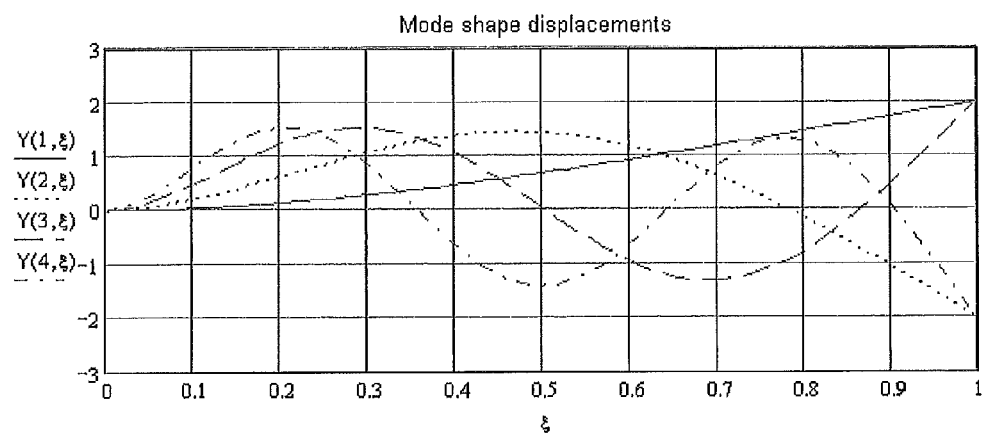
FIGS. 8a and 8b show the mode shape displacements and corresponding bending moments for a bimorph piezoelectric actuator.
Figure 8B:
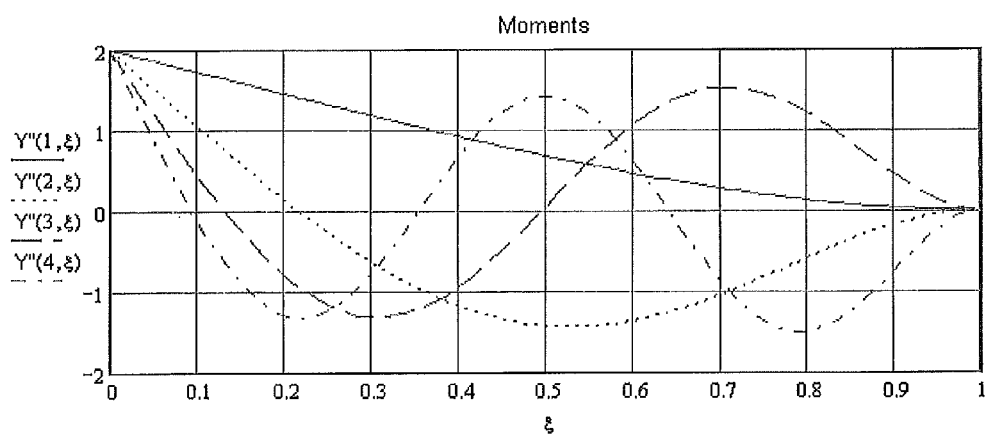

FIGS. 8a and 8b shows the mode shapes and corresponding curvature, or bending moment, of a bimorph actuator. In a similar manner to the previous embodiment, each piezoelectric layer is separated into two electrodes receiving input voltages a and b. The force applied may be given as:

$$F_n \propto a\int_0^{\xi_0} Y''(n,\xi)d\xi + b\int_{\xi_0}^1 Y''(n,\xi)d\xi \propto (Y(n,\xi_0))a + (Y(n,1) - Y(n,\xi_0))b$$

Where Y(n,ξ) are the mode shapes;

ξ is the normalised distance along each piezoelectric layer, and

ξ0 is the point at which the piezoelectric layers are separated into two electrodes.

Figure 8C:
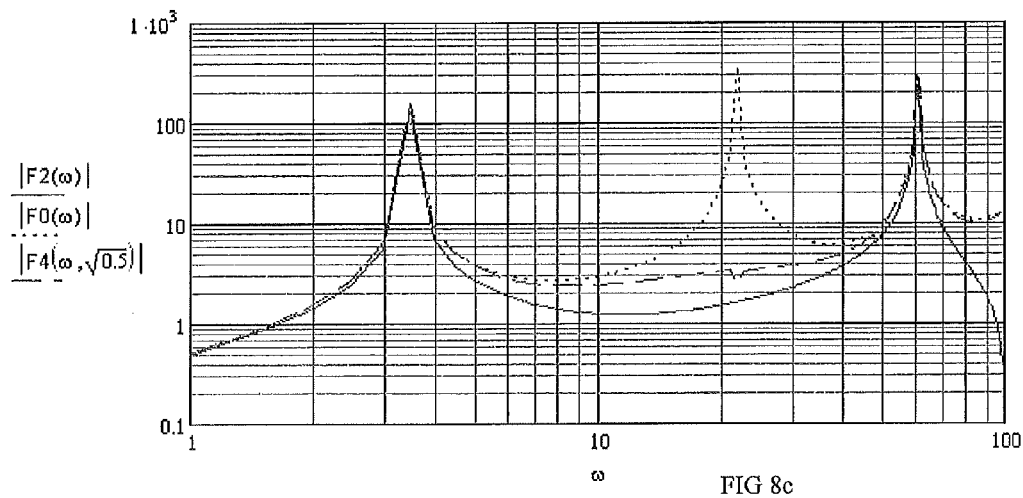
FIG. 8c compares the performance of a standard bimorph with two embodiments of uni-polar, single voltage bimorphs.

For a uni-polar, single voltage bimorph actuator, only one electrode is driven. Thus b is set to 0 and $F_n$ is solved for ξ0. This is a simple way of suppressing one mode. ξ0 is given by a zero of the slope of the mode-shape which corresponds to an anti-node of the mode shape itself. For example, to suppress the second mode, the appropriate value for ξ0 is 0.471. FIG. 8c compares the performance of a uni-polar, single voltage solution F2(ω) with that of a standard full electrode F0(ω). As is seen clearly, the second mode is suppressed.

If the loss in level due to the missing electrode region is unacceptable, the other electrode may be fed with the output of a notch filter tuned to the right frequency. A Butterworth tuning with a Q of 1/√2 appears correct. The performance of such a system is also shown in FIG. 8c as F4(ω,√0.5).

For a bipolar, single voltage bimorph actuator, both electrodes are driven with an equal and opposite voltage. This is another simple way of suppressing one mode. b is set to −a and the value of ξ0 is given by the solution to:

$$F_n \propto 2 \cdot Y(n, \xi 0) + Y(n, 1) = 0$$

Figure 8D:
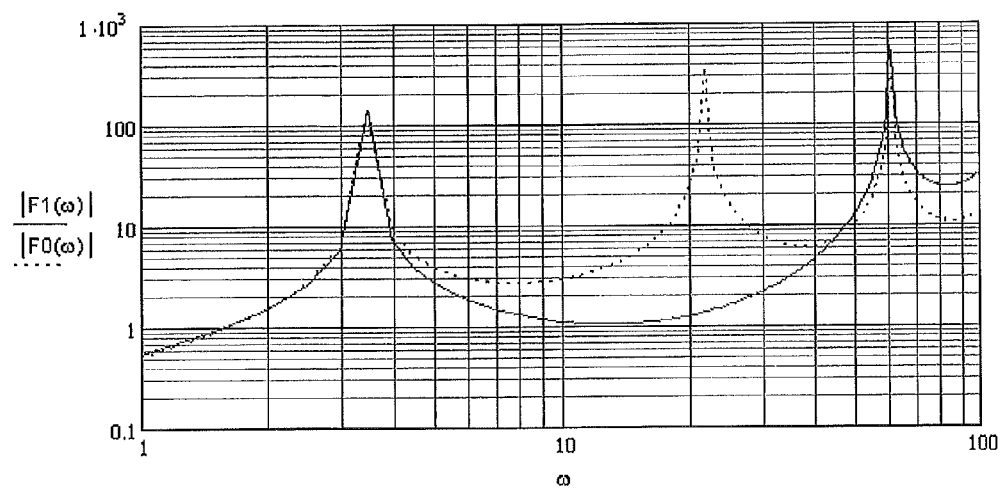
FIG. 8d compares the performance of a standard bimorph with a bi-polar, single voltage bimorph.

For example, to suppress the second mode, the appropriate value for ξ0 is 0.625. FIG. 8*d* compares the performance of such a bi-polar, single voltage solution F1(ω) with that of a standard full electrode F0(ω). As is seen clearly, the second mode is suppressed.

By co-operatively selecting both ξ0 and the ratio a:b, it is possible to suppress two modes. There are now the following equations to solve:

$$(Y(2,\xi 0))a + (Y(2,1) - Y(2,\xi 0))b = 0 (Y(3,\xi 0))a + (Y(3,1) - Y(3,\xi 0))b = 0$$

$$Y(2,\xi 0) \cdot Y(3,1) - Y(3,\xi 0) \cdot Y(2,1) = 0$$

Figure 8E:
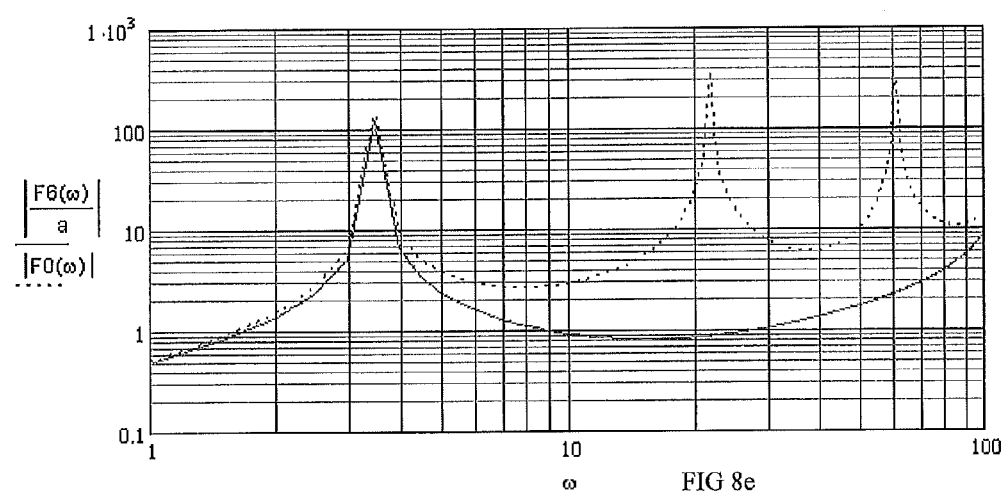
FIG. 8e compares the performance of a standard bimorph with a bi-polar, dual voltage bimorph.

The solution is given by ξ0=0.355, a=1, b=0.244 (to three significant figures). FIG. 8*e* compares the performance of such a bi-polar, dual voltage solution F6(ω) with that of a standard full electrode F0(ω). As is seen clearly, the second and third modes are suppressed.

As an alternative to dividing the piezoelectric layer into multiple electrodes, it is also possible to apply a variable potential to the bimorph actuator. For a distributed or variable potential, the resultant output is given by the integral of the potential weighted by the modal curvature. A variable potential which is orthogonal with all mode-moments except the first mode will suppress the other modes. It is a property of the bending differential equation that in addition to the mode-shapes, the bending moments are mutually orthogonal.

$$\int_0^1 Y(n,\xi) \cdot Y(m,\xi) d\xi = \int_0^1 Y''(n,\xi) \cdot Y''(m,\xi) d\xi = \delta_{nm},$$

i.e. 1 if n=m or 0 otherwise

Figure 8F:
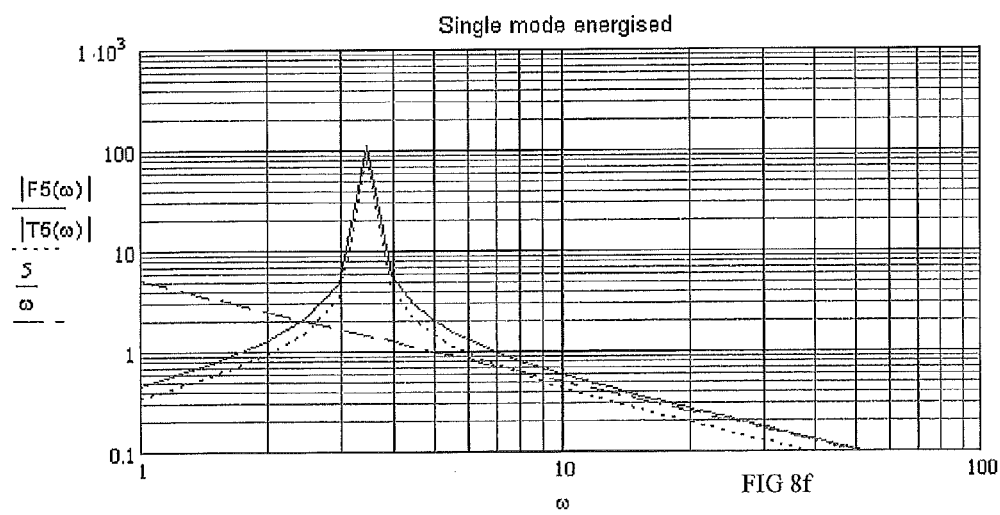
FIG. 8f is a graph of blocked force and blocked torque for a variable potential to be applied to a bimorph actuator.

Consequently, a potential profile that follows Y"(1,ξ) will not energise any of the higher modes. This produces a single peak at f0, and a first-order roll-off afterwards. FIG. 8*f* shows the blocked force and blocked torque for such a potential variation. It is noted that applying a continuously variable potential may be difficult. Accordingly, the two electrode solutions may be preferred.

The invention claimed is:

1. A method of making an actuator comprising a plurality of force elements, the method comprising:
   providing a coupler for coupling force from the force elements to a load;
   calculating a transfer function for each force element wherein the transfer functions allow the force provided to the load to be predicted;
   determining an error functional which is indicative of dips in the predicted force;
   calculating the parameters of the force elements which minimise the error functional, and
   coupling force elements having the calculated parameters to the coupler to make the actuator.

2. A method according to claim 1, wherein the parameters of the force elements include their location on the coupler and the force applied by each force element.

3. A method according to claim 1, comprising providing the coupler in the form of a resonant element having a plurality of resonant bending wave modes in the operative frequency including at least one anti-resonance and the error functional is indicative of the presence of the at least one anti-resonance.

4. A method according to claim 3, comprising coupling the force elements to the resonant element at or near the nodal lines of the at least one anti-resonance of the resonant element.

5. A method according to claim 3, comprising coupling the force elements to the resonant element at locations which suppress at least one of the second and third modes of the resonant element.

6. A method according to claim 5, comprising coupling first and second force elements to the resonant element on the nodal lines of the third mode and coupling a third force element to the resonant element on the nodal line of the second mode.

7. A method according to claim 1, comprising obtaining the transfer functions by measurement.

8. A method according to claim 1, comprising obtaining the transfer functions by numerical analysis.

9. A method according to claim 1, comprising obtaining the transfer functions by knowledge of a mathematical expression for the behaviour of the system.

10. An electromagnetic actuator made by the method of claim 1, the actuator comprising a magnet assembly having a plurality of magnets and a voice coil assembly having a plurality of voice coils which are supported on the coupler and which cooperate with the magnets to form the force elements.

11. An actuator according to claim 10, wherein the coupler is annular and the voice coils are mounted at relative locations 0.43, 0.56 and 0.69 along the radius of the coupler.

12. An actuator according to claim 10, wherein the forces applied by each voice coil are 0.05 N for the outer Voice coil, 0.17 N for the centre voice coil and 0.15 N for the inner voice coil.

* * * * *